(12) United States Patent
Yoshida

(10) Patent No.: US 7,806,078 B2
(45) Date of Patent: Oct. 5, 2010

(54) PLASMA TREATMENT APPARATUS

(75) Inventor: Kazuto Yoshida, Kobe (JP)

(73) Assignee: Mitsubishi Heavy Industries, Ltd., Tokyo (JP)

(*) Notice: Subject to any disclaimer, the term of this patent is extended or adjusted under 35 U.S.C. 154(b) by 14 days.

(21) Appl. No.: 11/608,130

(22) Filed: Dec. 7, 2006

(65) Prior Publication Data
US 2007/0090032 A1    Apr. 26, 2007

Related U.S. Application Data

(62) Division of application No. 10/636,590, filed on Aug. 8, 2003, now abandoned.

(30) Foreign Application Priority Data
Aug. 9, 2002    (JP) .............. 2002-232332

(51) Int. Cl.
C23C 16/455    (2006.01)
C23C 16/507    (2006.01)
C23C 16/06     (2006.01)
C23C 16/22     (2006.01)

(52) U.S. Cl. .............. 118/723 I; 118/723 R; 156/345.33; 156/345.48

(58) Field of Classification Search .......... 118/723 I, 118/723 R; 156/345.33, 345.48
See application file for complete search history.

(56) References Cited

U.S. PATENT DOCUMENTS

| 5,134,965 | A | 8/1992 | Tokuda et al. |
| 5,792,272 | A * | 8/1998 | van Os et al. ............ 118/723 R |
| 6,086,677 | A | 7/2000 | Umotoy et al. |
| 6,143,078 | A * | 11/2000 | Ishikawa et al. ............ 118/715 |
| 6,402,849 | B2 * | 6/2002 | Kwag et al. .................. 118/715 |
| 2002/0195124 | A1 * | 12/2002 | Chin et al. ..................... 134/18 |
| 2004/0099378 | A1 * | 5/2004 | Kim et al. .............. 156/345.33 |
| 2006/0112876 | A1 * | 6/2006 | Choi et al. .................. 118/715 |

FOREIGN PATENT DOCUMENTS

| EP | 1103632 A1 | 5/2001 |
| JP | 10-98028 A | 4/1998 |
| JP | 2002-1100 A | 1/2002 |
| WO | WO-97/03223 A1 | 1/1997 |

* cited by examiner

*Primary Examiner*—Rudy Zervigon
(74) *Attorney, Agent, or Firm*—Birch, Stewart, Kolasch & Birch, LLP

(57) ABSTRACT

A plasma CVD apparatus has a container, and channels composed of introduction grooves and circumferential grooves for different types of gases are formed within the container. The gases introduced through source gas piping, auxiliary gas piping, and cleaning gas piping are equally supplied to a plurality of supply nozzles, a plurality of auxiliary gas supply nozzles, and a plurality of cleaning gas nozzles. The configuration of the container can be simplified without complicating pipings for the gases.

9 Claims, 6 Drawing Sheets

PLASMA TREATMENT APPARATUS

This application is a Divisional of co-pending application Ser. No. 10/636,590, filed on Aug. 8, 2003 now abandoned, the entire contents of which are hereby incorporated by reference and for which priority is claimed under 35 U.S.C. §120.

The entire disclosure of Japanese Patent Application No. 2002-232332 filed on Aug. 9, 2002, including specification, claims, drawings and summary, is incorporated herein by reference in its entirety.

BACKGROUND OF THE INVENTION

1. Field of the Invention

This invention relates to a plasma treatment apparatus for forming a film on the surface of a substrate by vapor deposition.

2. Description of the Related Art

Currently, film formation using a plasma CVD (chemical vapor deposition) system is known for production of a semiconductor. The plasma CVD system is a system in which a source gas for constituting a film is introduced into a film formation chamber within a container, high frequency waves are shot from a high frequency antenna to convert the source gas into the state of a plasma, and excited active atoms in the plasma promote chemical reactions on the surface of the substrate to carry out film formation.

In the plasma CVD system, an auxiliary gas and a cleaning gas for performing cleaning are introduced, along with the source gas which will become the material for the film. Thus, pipings for introducing a plurality of gases are connected to the container. A plurality of gas nozzles are provided in the circumferential direction of the container which is cylindrical in shape.

In the conventional plasma CVD system, the plurality of gas nozzles are provided in the container such that plural types of gas nozzles for the different types of gases are present, and plural gas nozzles of each type are present. To avoid mixing of the different gases, therefore, the same number of the pipings as the number of the gas nozzles are connected for each of the types of the gases. As a result, the piping system is complicated, making the configuration of the container complicated, eventually making the manufacture and disassembly of the container difficult.

To prevent gas leakage, etc. under these circumstances, much labor and a plenty of time have been required in inspecting the weld zone of the piping or testing for connection of the piping system. Depending on individual differences of the pipings, the gas flow rate or the pressure loss differs, and may cause imbalances in the amounts of the gases supplied.

SUMMARY OF THE INVENTION

The present invention has been accomplished in the light of the above-mentioned problems with the earlier technologies. The present invention provides a plasma treatment apparatus which can simply the configuration of the container without complicating the pipings for gases.

According to a first aspect of the present invention, there is provided a plasma treatment apparatus which introduces a treatment gas into a treatment chamber through a treatment gas nozzle, and generates a plasma in the treatment chamber to treat a surface of a substrate with atoms and molecules excited and activated in the treatment chamber, comprising:

a container defining the treatment chamber;

a groove, formed in a thick-walled portion between an outer wall and an inner wall of the container, for allowing passage of the treatment gas; and the treatment gas nozzle connected to the groove.

Because of this feature, the container can be simplified without the need to provide gas piping for each of the treatment gas nozzles.

Consequently, the plasma CVD apparatus can simplify the configuration of the container without complicating the gas pipings.

According to a second aspect of the invention, there is provided a plasma treatment apparatus which introduces a treatment gas into a treatment chamber through a treatment gas nozzle, and generates a plasma in the treatment chamber to treat a surface of a substrate with atoms and molecules excited and activated in the treatment chamber, comprising:

a container defining the treatment chamber, the container being divided into an upper container and a lower container;

a circumferential groove, formed in the upper container, for allowing passage of the treatment gas;

the treatment gas nozzle connected to the circumferential groove;

an introduction groove, formed in the lower container, for allowing passage of the treatment gas;

treatment gas introduction means connected to the introduction groove; and communication means for bringing the circumferential groove and the introduction groove into communication with each other at a plurality of locations.

Because of this feature, the container can be simplified and is divisible, without the need to provide gas piping for each of the treatment gas nozzles.

Consequently, the plasma CVD apparatus can simplify the configuration of the container without complicating the gas pipings. Also, the container is easy to assemble and disassemble, and its maintainability and inspectability can be improved.

In the plasma treatment apparatus according to the second aspect of the invention, the introduction groove may be formed over a length of nearly a half of a circumference in a circumferential direction of the container; the treatment gas introduction means may be in communication with a halfway portion of the introduction groove; and the communication means may be in communication with opposite ends of the introduction groove. Because of this feature, the treatment gases can be equally supplied.

In the plasma treatment apparatus according to the second or third aspect of the invention, the circumferential groove, the introduction groove, a portion of communication between the treatment gas nozzle and the circumferential groove, a portion of communication between the treatment gas introduction means and the introduction groove, and the communication means for establishing communication between the circumferential groove and the introduction groove may be each formed by machining. According to this feature, machining can be performed easily.

In the plasma treatment apparatus according to any one of the second to fourth aspects of the invention, a seal ring member may be provided at a junction between the upper container and the lower container, and disposed on a side opposite to the treatment chamber, with the communication means for communication between the circumferential groove and the introduction groove being located between the seal ring member and the treatment chamber. Because of this feature, gas leakage is unlikely even with the use of a simple seal ring member.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PRESENT INVENTION

Embodiments of the present invention will now be described in detail with reference to the accompanying drawings, which in no way limit the invention.

Figure 1:
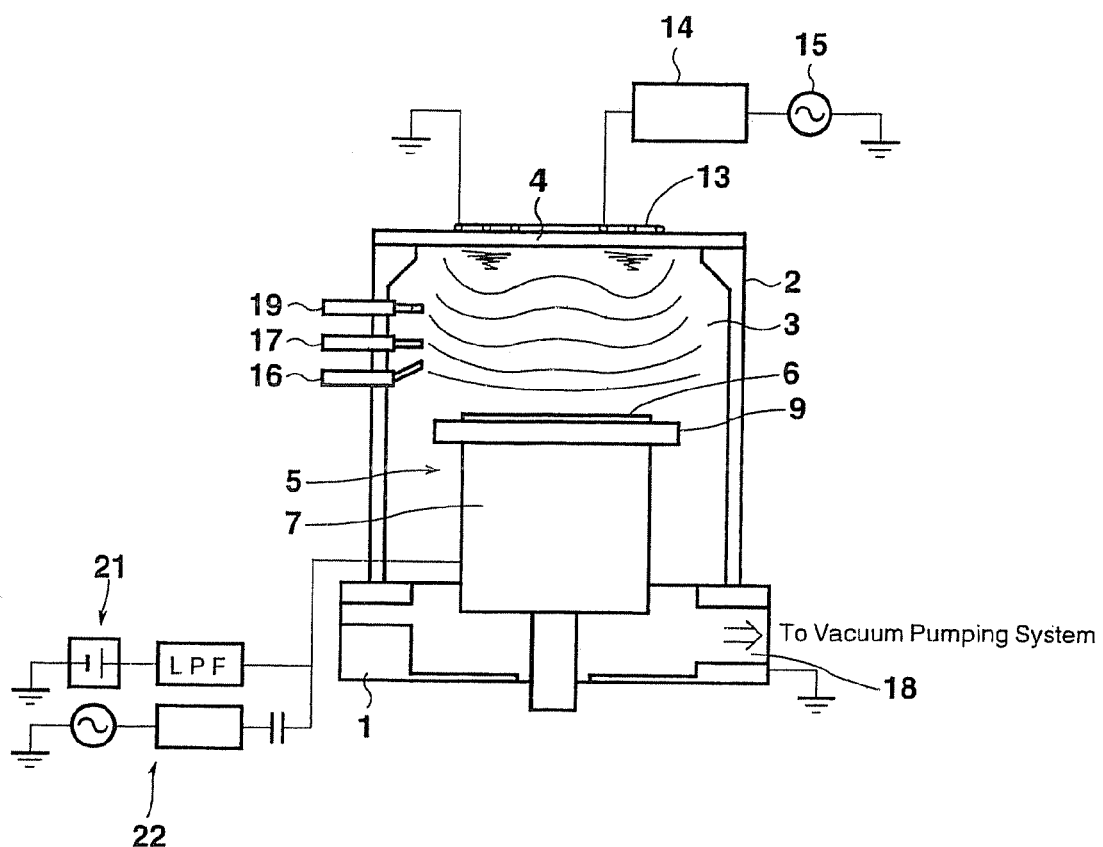
FIG. 1 is a schematic side view of a plasma CVD apparatus according to an embodiment of the present invention.
Figure 2:
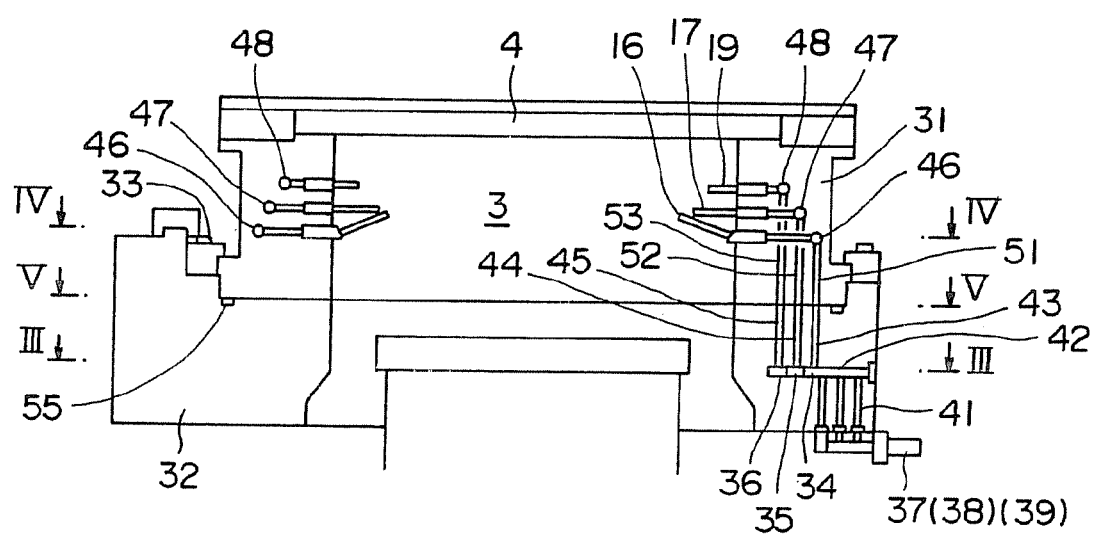
FIG. 2 is a sectional view of essential parts of a container showing the concrete situation of gas pipings.
Figure 3:
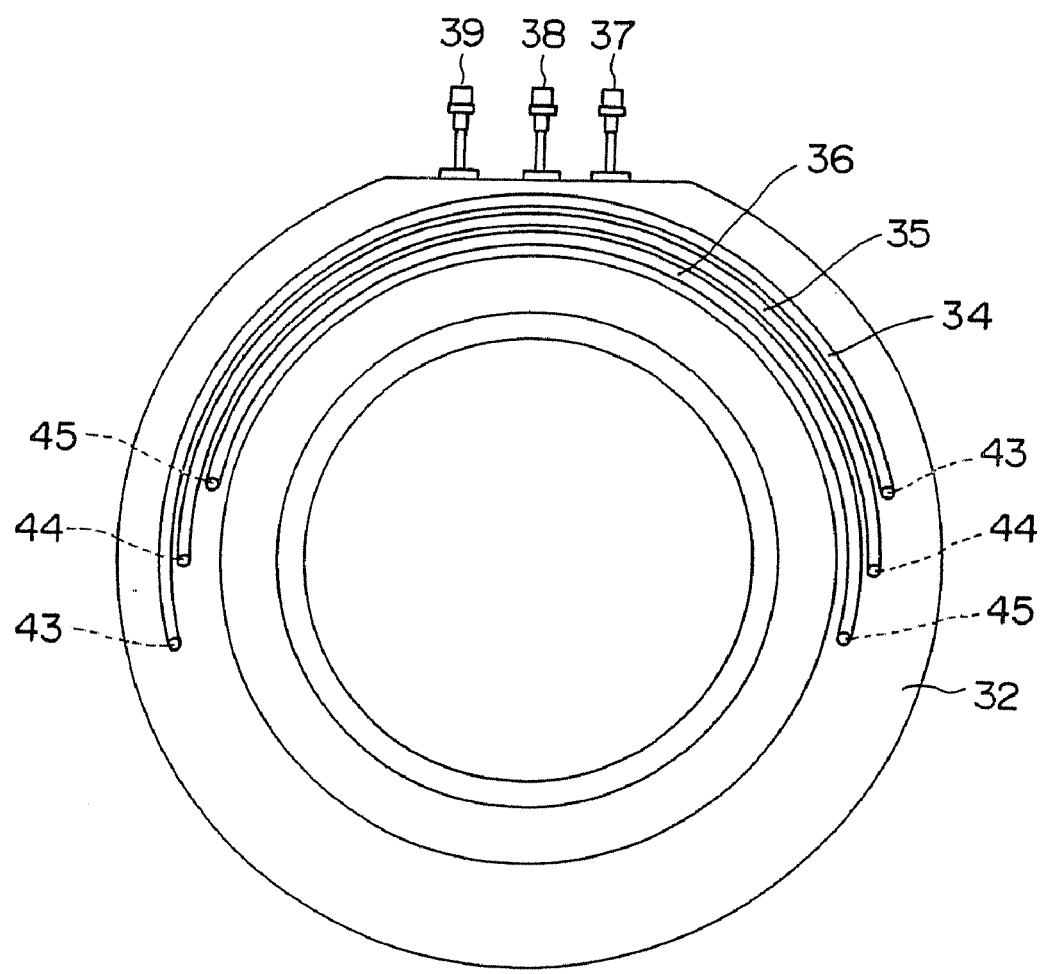
FIG. 3 is a view taken along line III-III of FIG. 2.
Figure 4:
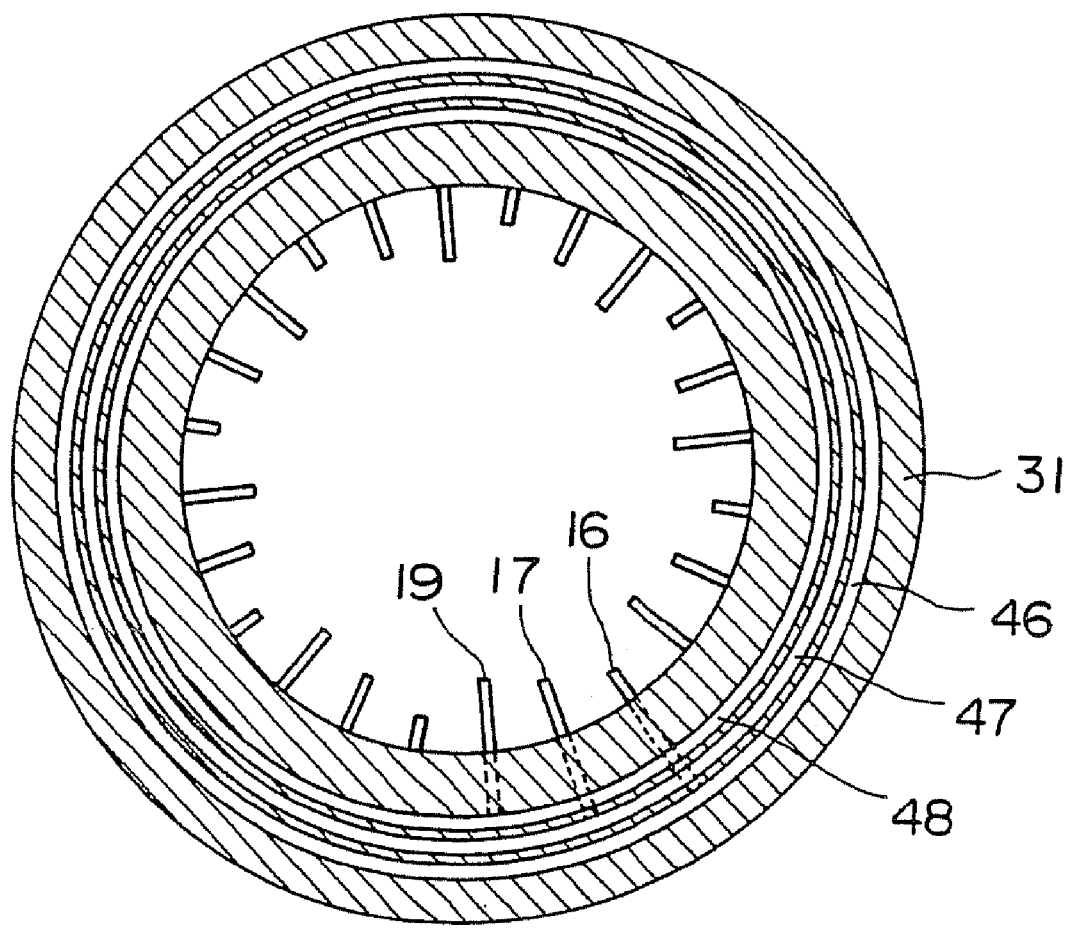
FIG. 4 is a view taken along line IV-IV of FIG. 2.
Figure 5:
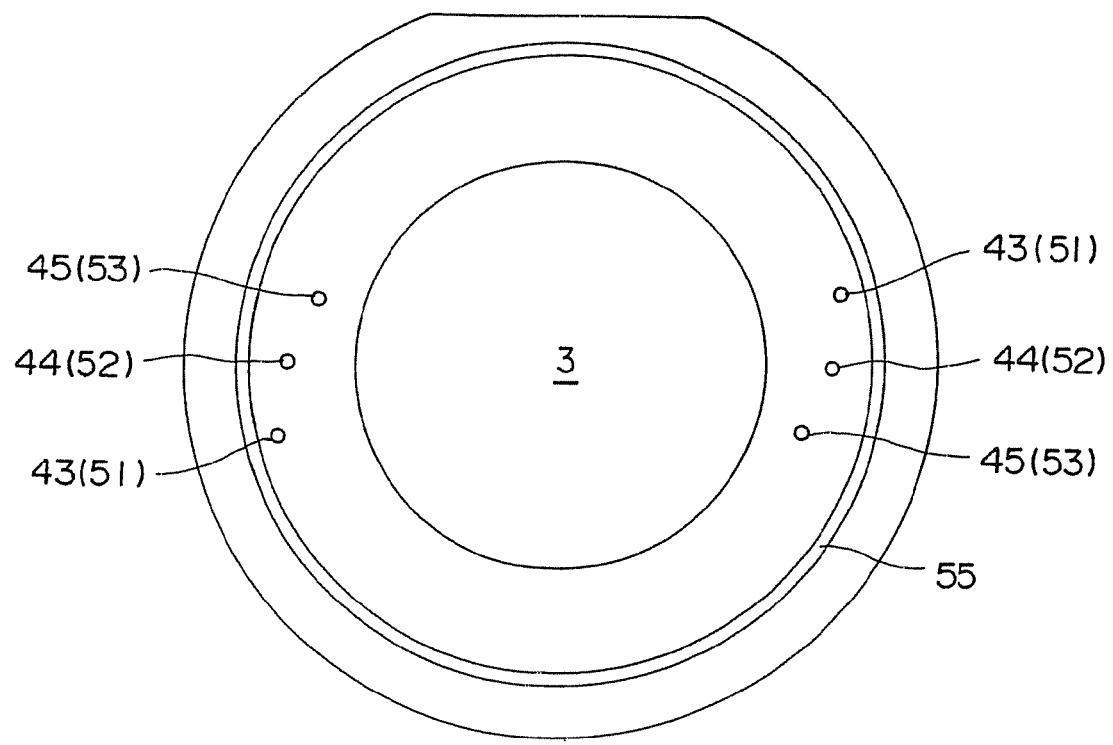
FIG. 5 is a view taken along line V-V of FIG. 2.
Figure 6:
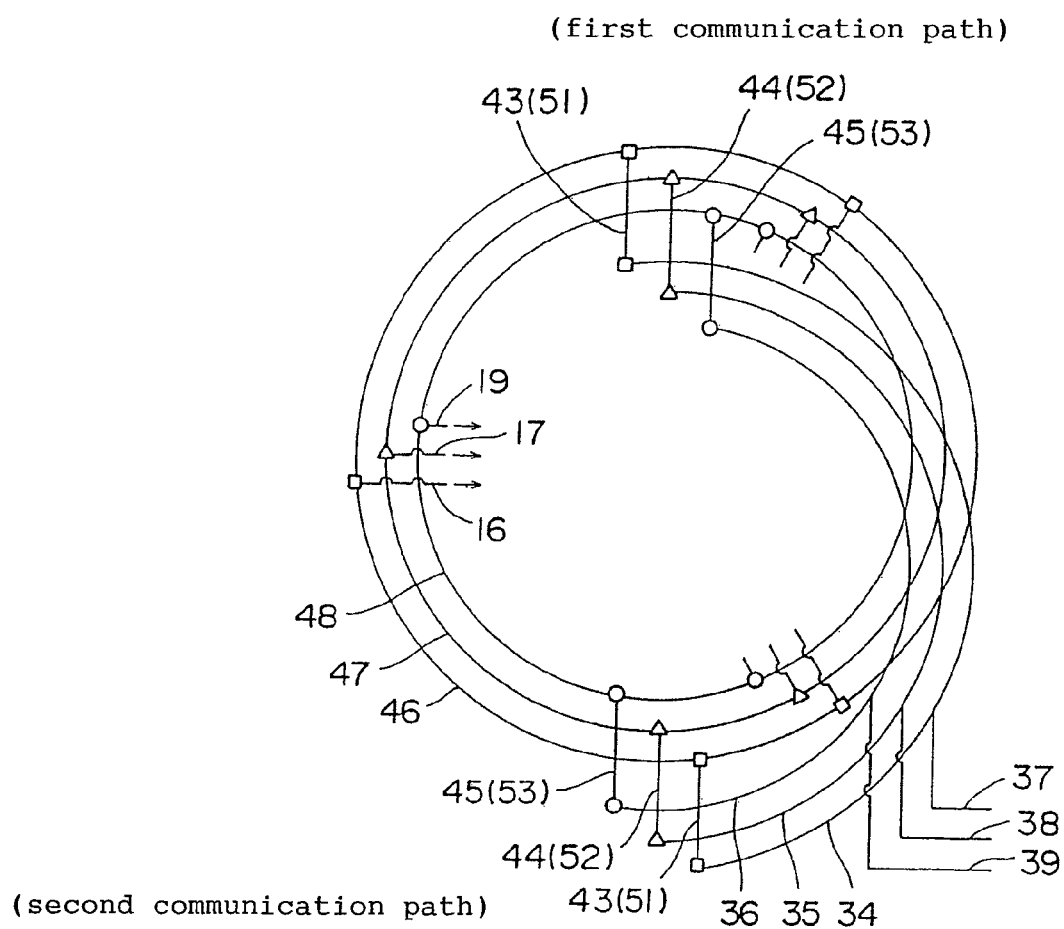
FIG. 6 is a conceptual view showing the situation of connection of the gas pipings.

FIG. 1 is a schematic side view of a plasma CVD apparatus according to an embodiment of the present invention. FIG. 2 is a sectional view of essential parts of a container showing the concrete situation of gas pipings. FIG. 3 is a view taken along line III-III of FIG. 2. FIG. 4 is a view taken along line IV-IV of FIG. 2. FIG. 5 is a view taken along line V-V of FIG. 2. FIG. 6 is a conceptual view showing the situation of connection of the gas pipings.

As shown in FIG. 1, a cylindrical aluminum container 2 is provided on a base 1, and a film formation chamber 3 as a treatment chamber is defined within the container 2. A circular RF entrance window 4 is provided at the top of the container 2. The film formation chamber 3 at the center of the container 2 is equipped with a support stand device 5. The support stand device 5 has a bearing portion 9 which electrostatically attracts and holds a substrate 6 of a semiconductor. A holding mechanism 7 equipped with an electrostatic chuck support mechanism is provided below the bearing portion 9.

A direct current power source 21 and a bias applying high frequency power source 22 are connected to the holding mechanism 7 of the support stand device 5 to generate low frequency waves in the bearing portion 9 and also produce an electrostatic force therein. The support stand device 5 is free to move up and down as a whole, so that its height in the vertical direction can be adjusted to an optimal height.

On the RF entrance window 4, a high frequency antenna 13 of, for example, a circular ring shape is disposed. A plasma generating high frequency power source 15 is connected to the high frequency antenna 13 via a matching instrument 14. By supplying an electric power to the high frequency antenna 13, electromagnetic waves are shot into the film formation chamber 3 of the container 2. The electromagnetic waves shot into the container 2 ionize gases in the film formation chamber 3 to generate a plasma.

The container 2 is provided with gas supply nozzles 16, as treatment gas nozzles, for supplying a source gas such as a silane (for example, $SiH_4$). The source gas, which will become a film forming material (for example, Si), is supplied into the film formation chamber 3 through the gas supply nozzles 16.

The container 2 is also provided with auxiliary gas supply nozzles 17, as treatment gas nozzles, for supplying an inert gas (rare gas), such as argon or helium, or an auxiliary gas such as oxygen or hydrogen. Moreover, the container 2 is provided with cleaning gas nozzles 19, as treatment gas nozzles, for supplying a fluorine-based gas or a chlorine-based gas (cleaning gas) which carries out cleaning.

An exhaust port 18, which is connected to a vacuum pumping system (not shown) for evacuating the interior of the container 2, is provided in the base 1. Also, a carry-in/carry-out port for the substrate 6 is provided in the container 2, although it is not shown, for carrying the substrate 6 from a transport chamber (not shown) into the container 2 and carrying the substrate 6 out of the container 2 to the transport chamber.

In the above-described plasma CVD apparatus, the substrate 6 is placed on the bearing portion 9 of the support stand device 5, and electrostatically attracted thereto. The source gas at a predetermined flow rate was supplied through the gas supply nozzles 16 into the film formation chamber 3, while the auxiliary gas at a predetermined flow rate was supplied through the auxiliary gas supply nozzles 17 into the film formation chamber 3. The interior of the film formation chamber 3 is set at a predetermined pressure adapted to the film forming conditions.

Then, the electric power is supplied from the high frequency power source 15 to the high frequency antenna 13 to generate high frequency waves. On the other hand, the electric power is supplied from the direct current power source 21 to the bearing portion 9 to generate low frequency waves.

By these means, the source gas within the film formation chamber 3 discharges, and partly comes into a plasma state. This plasma collides with other neutral molecules in the source gas, further ionizing or exciting the neutral molecules. The so formed active particles are attracted to the surface of the substrate 6 to cause a chemical reaction with high efficiency, thereby depositing thereon to form a CVD film.

When film formation on the substrate 6 is repeatedly performed, the film forming material adheres to and deposits on the inner wall of the film formation chamber 3, namely, the wall surface of the container 2 or the surface of the RF entrance window 4. In this case, the plasma is generated, with the cleaning gas being supplied through the cleaning gas nozzles 19, to etch away the film forming material.

The types of the gas nozzles in the above-described embodiment are only for illustration, and any types of gas nozzles, including a single type to a plurality of types, can be provided.

The configuration of the gas pipings will be described concretely with reference to FIGS. 2 to 6.

As shown in FIG. 2, the container 2 defining the film formation chamber 3 is divided into an upper container 31 and a lower container 32, which were mechanically bonded together by bolts 33. As shown in FIGS. 2 and 3, introduction grooves 34, 35, 36, which are each formed over the length of nearly a half of a circumference in the circumferential direction of the container 2, are formed in the lower container 32. The introduction grooves 34, 35, 36 serve as channels for the gases.

Source gas piping 37, as treatment gas introduction means, is connected to a halfway portion of the introduction groove 34. Auxiliary gas piping 38, as treatment gas introduction means, is connected to a halfway portion of the introduction groove 35. Cleaning gas piping 39, as treatment gas introduction means, is connected to a halfway portion of the introduction groove 36.

As shown in FIG. 2, the introduction grooves 34, 35, 36 and the source gas piping 37, auxiliary gas piping 38, and cleaning gas piping 39 are connected to each other in communication with vertical channels 41 and horizontal channels 42. The introduction grooves 34, 35, 36, the vertical channels 41, and the horizontal channels 42 are formed by machining. The horizontal channels 42 are each machined, starting at the circumferential surface of the lower container 32, and a circumferential surface portion of the horizontal channel 42 is closed with a blind member. The vertical channels 41 are machined, starting at the lower surface of the lower container 32, and brought into communication with the horizontal channels 42. The source gas piping 37, auxiliary gas piping 38, and cleaning gas piping 39 are connected to lower surface portions of the vertical channels 41.

The formation of the channels by machining enables simple processing to construct the container 2.

The lower ends of lower communication paths 43, 44, 45, as communication means, communicate with both ends of the introduction grooves 34, 35, 36, respectively. The lower communication paths 43, 44, 45 are vertically machined, starting at the upper surface of the lower container 32, and are brought into communication with the opposite ends of the introduction grooves 34, 35, 36, respectively.

The introduction grooves 34, 35, 36 may be provided in a circumferential form in the entire circumferential direction of the container 2, and the lower communication paths 43, 44, 45, as communication means, may be provided at 3 or more locations with equal spacing.

As shown in FIGS. 2 and 4, on the other hand, circumferential grooves 46, 47, 48, which are formed in the circumferential direction of the container 2, are formed in the upper container 31. The circumferential grooves 46, 47, 48 serve as channels for gases. The upper ends of upper communication paths 51, 52, 53, as communication means, communicate with the circumferential grooves 46, 47, 48, respectively.

The upper communication paths 51, 52, 53 are provided in correspondence with the lower communication paths 43, 44, 45. The upper communication paths 51, 52, 53 are machined in the vertically direction, starting at the lower surface of the upper container 31, and have the upper ends in communication with the circumferential grooves 46, 47, 48. The lower ends of the upper communication paths 51, 52, 53 are connected to the upper ends of the lower communication paths 43, 44, 45.

The circumferential groove 46 is bored so that a plurality of the gas supply nozzles 16 are connected thereto with equal spacing in the circumferential direction. The circumferential groove 47 is bored so that a plurality of the auxiliary gas supply nozzles 17 are connected thereto with equal spacing in the circumferential direction. The circumferential groove 48 is bored so that a plurality of the cleaning gas nozzles 19 are connected thereto with equal spacing in the circumferential direction.

That is, as shown in FIG. 6, the source gas fed from the source gas piping 37 to the introduction groove 34 is fed from the opposite ends of the introduction groove 34 to the circumferential groove 46 through the lower communication paths 43 and the upper communication paths 51, (i.e., one end of the introduction groove 34 and the circumferential groove 46 are connected by a first communication path (communication paths 43 (51)), and the other end of the introduction groove and the circumferential groove 46 are connected by a second communication path (communication paths 43 (51)), whereafter the source gas is supplied to the gas supply nozzles 16 through the circumferential groove 46.

Similarly, the auxiliary gas fed from the auxiliary gas piping 38 to the introduction groove 35 is fed from the opposite ends of the introduction groove 35 to the circumferential groove 47 through the lower communication paths 44 and the upper communication paths 52, whereafter the auxiliary gas is supplied to the auxiliary gas supply nozzles 17 through the circumferential groove 47.

Furthermore, the cleaning gas fed from the cleaning gas piping 39 to the introduction groove 36 is fed from the opposite ends of the introduction groove 36 to the circumferential groove 48 through the lower communication paths 45 and the upper communication paths 53, whereafter the cleaning gas is supplied to the cleaning gas nozzles 19 through the circumferential groove 48.

As shown in FIGS. 2 and 5, a seal ring 55 is provided at the junction between the upper container 31 and the lower container 32. The seal ring 55 is disposed on the side opposite to the film formation chamber 3 (i.e., outwardly of the film formation chamber 3), with the communication means composed of the lower communication paths 43, 44, 45 and the upper communication paths 51, 52, 53 being located between the seal ring 55 and the film formation chamber 3. Treatments, such as film formation, are performed, with the interior of the film formation chamber 3 being kept in a vacuum state. Even if the gases leak and the seal ring 55 does not function, therefore, the gases do not escape to the outside of the container 2 because of a pressure differential.

With the above-described plasma CVD apparatus, therefore, the channels for different types of gases are formed within the container 2 by the grooves, and the gases introduced through the source gas piping 37, the auxiliary gas piping 38 and the cleaning gas piping 39 are equally supplied to the plural gas supply nozzles 16, the plural auxiliary gas supply nozzles 17, and the plural cleaning gas nozzles 19.

This configuration obviates the necessity for providing piping for each of the plurality of gas supply nozzles 16, auxiliary gas supply nozzles 17 and cleaning gas nozzles 19. Hence, the container 2 is of a simple structure, so that its maintainability increases, its assembly and disassembly are simplified, and its inspectability improves.

Besides, the gases are supplied from the opposite ends of the introduction grooves 34, 35, 36 to the circumferential grooves 46, 47, 48. Thus, the gases are equally distributed to the plural gas supply nozzles 16, the plural auxiliary gas supply nozzles 17, and the plural cleaning gas nozzles 19. As a result, the flows of the gases and the distributions of the pressure losses are uniform and ideal, so that the occurrence of differences among the individual pipings, etc. can be suppressed.

In addition, the channels for the gases are not exposed to the atmosphere. Thus, there is no risk of leakage, there is no mixing of the different types of gases, and safety is increased. Moreover, a simple seal is sufficient for sealing purposes. Even if a sealing failure occurs, leakage of the gases to the outside of the container 2 is unlikely.

Additionally, the container 2 is divided into the upper container 31 and the lower container 32. The circumferential grooves 46, 47, 48 and the gas supply nozzles 16, auxiliary gas supply nozzles 17 and cleaning gas nozzles 19 are provided in the upper container 31. Thus, when the arrangement of the nozzles, for example, is to be changed, replacement of the upper container 31 alone suffices, so that the general-purpose properties of the container 2 can be improved.

These features result in the provision of a plasma CVD apparatus in which the configuration of the container 2 can be simplified without the need to complicate the pipings for the gases.

With a plasma CVD system, temperature control means is provided outside a container 2 to exercise temperature control of film formation while suppressing temperature changes. For this purpose, it is common practice to provide electrical heating/cooling means, chiller piping and, if desired, a heat insulating material, etc., thereby constructing a container 2 minimally varying in temperature.

With the above-described plasma CVD apparatus, the channels for the different types of gases are formed within the container 2 by the grooves, and the wall thickness of the container 2 (upper container 31, lower container 32) is increased. Thus, the time constant of temperature can be decreased to increase heat capacity.

Consequently, there is no need to provide a high capacity heater or a cooling structure in order to suppress temperature changes. Nor is a temperature control member needed. Nonetheless, ideal temperature control can be exercised.

The present invention may be constituted such that the grooves are formed at least in the container 2, whereby the channels for the gases are provided to dispense with piping. As long as the channels for the gases are formed by the grooves, the container 2 need not be divided. Alternatively, the grooves may be formed by use of molds during casting, without relying on machining.

While the present invention has been described in the foregoing fashion, it is to be understood that the invention is not limited thereby, but may be varied in many other ways. Such variations are not to be regarded as a departure from the spirit and scope of the invention, and all such modifications as would be obvious to one skilled in the art are intended to be included within the scope of the appended claims.

What is claimed is:

1. A plasma treatment apparatus which introduces a treatment gas into a treatment chamber, and generates a plasma in said treatment chamber to treat a surface of a substrate with atoms and molecules excited and activated in said treatment chamber, comprising:
    a container defining said treatment chamber and including an upper container and a lower container connected to said upper container;
    a circumferential groove, formed in said upper container, for allowing passage of said treatment gas;
    a plurality of treatment gas nozzles connected to said circumferential groove and arranged uniformly along the circumferential groove;
    an introduction groove, formed in said lower container, for allowing passage of said treatment gas, said introduction groove terminating at a first end and a second end after extending for a length of nearly a half of a circumference in a circumferential direction of said container;
    treatment gas introduction means connected to said introduction groove, said treatment gas introduction means in communication with a halfway portion of said introduction groove; and
    communication paths including a first communication path that extends and allows communication between the first end of said introduction groove and a first portion of said circumferential groove, and a second communication path that extends and allows communication between the second end of said introduction groove and a second portion of said circumferential groove, the first portion and the second portion being portions in said circumferential groove that do not oppose any of said plurality of treatment gas nozzles with respect to a circumferential direction of the circumferential groove.

2. The plasma treatment apparatus, according to claim 1, wherein the treatment gas introducing means is in communication with a central portion of the introduction groove.

3. The plasma treatment apparatus according to claim 1, wherein
    said circumferential groove, said introduction groove, a portion of communication between said treatment gas nozzles and said circumferential groove, a portion of communication between said treatment gas introduction means and said introduction groove, and said communication paths for establishing communication between said circumferential groove and said introduction groove are each formed by machining.

4. The plasma treatment apparatus according to claim 1, wherein
    the introduction groove extends in a horizontal direction,
    the communication paths extend in a vertical direction, and
    the circumferential groove extends in the horizontal direction.

5. The plasma treatment apparatus according to claim 1, wherein the circumferential groove extends along an entire circumference in the circumferential direction of the container.

6. The plasma treatment apparatus according to claim 1, wherein the treatment gas nozzles extend into the treatment chamber.

7. The plasma treatment apparatus according to claim 1, further comprising:
    a seal ring member provided at a junction between said upper container and said lower container, and disposed at a side opposite to said treatment chamber with respect to said communication paths.

8. The plasma treatment apparatus according to claim 7, wherein, said seal ring member is the only seal ring member disposed between said upper container and said lower container.

9. The plasma treatment apparatus according to claim 1, wherein the plurality of treatment gas nozzles includes a plurality of gas supply nozzles, a plurality of auxiliary gas supply nozzles, and a plurality of cleaning gas nozzles.

* * * * *